Figure 1A:
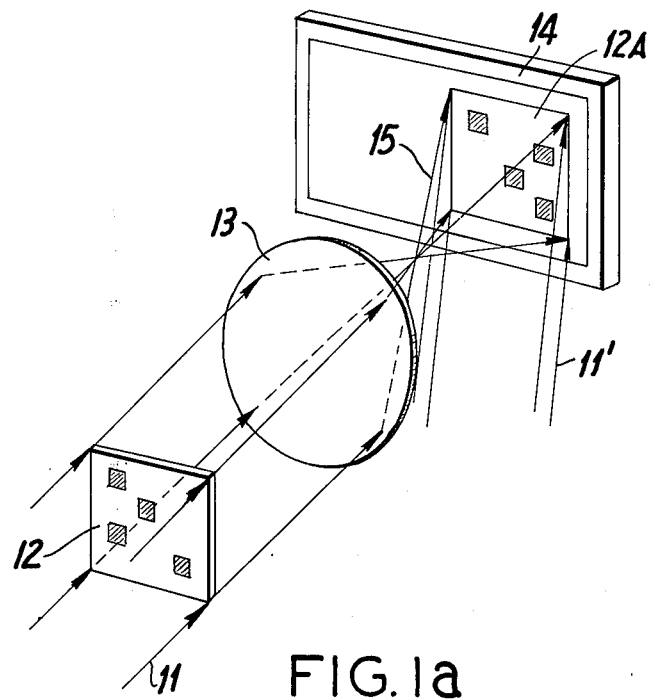

United States Patent
Miyazaki et al.

[11] 3,949,235
[45] Apr. 6, 1976

[54] LARGE HOLOGRAPHIC MEMORY WITH PLURAL OVERLAPPING DETECTOR ARRAYS

[75] Inventors: Suehiro Miyazaki, Yokohama; Itsuo Matsubara, Fujisawa; Masahiro Moriwaki, Tokyo; Mitsuhito Sakaguchi, Tokyo; Nobuo Nishida, Tokyo, all of Japan

[73] Assignees: Nippon Telegraph & Telephone Public Corporation; Nippon Electric Company Limited, both of Tokyo, Japan

[22] Filed: Mar. 12, 1974

[21] Appl. No.: 450,398

[30] Foreign Application Priority Data
Mar. 14, 1973 Japan ............................. 48-28963
Mar. 14, 1973 Japan ............................. 48-28965

[52] U.S. Cl. ............... 250/578; 250/209; 250/550; 340/173 LM; 350/3.5
[51] Int. Cl.² ........................................... G03H 1/30
[58] Field of Search .................. 350/3.5, DIG. 1; 340/173 LM; 250/568–570, 578, 550, 209; 235/61, 115

[56] References Cited
UNITED STATES PATENTS

| | | | |
|---|---|---|---|
| 3,542,448 | 11/1970 | Reynolds et al. | 350/3.5 |
| 3,573,433 | 4/1971 | Harris | 340/173 LM |
| 3,576,545 | 4/1971 | Meilleroux | 340/173 LM |
| 3,758,187 | 9/1973 | Thomas et al. | 350/3.5 |
| 3,832,565 | 8/1974 | Graf et al. | 350/3.5 |

*Primary Examiner*—Ronald J. Stern
*Attorney, Agent, or Firm*—Hopgood, Calimafde, Kalil, Blaustein & Lieberman

[57] ABSTRACT

Relatively large hologram storage plates, e.g., those storing a large number of discrete entries such as character definitions for a large character set, comprise an array of mini-holograms arranged in different memory plate sections.

A different photodiode array is associated with each hologram plate section (for efficiency, some elements of different diode arrays may be common). When the stored contents of any mini-hologram are interrogated by a coherent light beam, the stored information is derived via the associated photodiode array and converged (as by OR logic) to memory output terminals.

5 Claims, 4 Drawing Figures

LARGE HOLOGRAPHIC MEMORY WITH PLURAL OVERLAPPING DETECTOR ARRAYS

DISCLOSURE OF INVENTION

This invention relates to holography and, more specifically, to an improved method and apparatus for forming and utilizing hologram storage plates of a relatively large size, obviating the inaccuracies attendant to prior art hologram structures where, upon read out, light beams from all entries stored on a hologram plate are detected by a single photodiode array.

The inventors of the present invention disclosed in U.S. Pat. No. 3,658,402 (the disclosure of which is incorporated herein by reference) holographic tablet devices, in which the X and Y coordinates of a number of small points on a plane are translated into an array of binary-code-representing coherent light beams. The beams are recorded on a photographic plate in the form of mini-holograms arranged in a matrix format, and in which the mini-holograms are then sequentially and individually illuminated by a coherent light beam to successively produce reconstructed coherent light beam arrays which are translated back to a parallel binary word by an array of photodiodes to reproduce the positional data of the respective illuminated mini-holograms. Such a hologram tablet device finds application in character- and pattern-input apparatus for computers, automatic control apparatus, digital type position control apparatus for servo systems, and the like.

When such a hologram tablet device is used as a computer input device for Chinese characters, hand written characters or various graphic patterns, or in a digital positioning control device, the number of recorded holograms must be increased to the degree possible to increase the number of input characters and symbols, and to improve the accuracy of signal conversion or positional resolving power. However, since there is a lower limit for the size of the individual mini-holograms, an increase in the number of mini-holograms to achieve a larger memory content inevitably results in a larger holographic memory plate. In a practical implimentation of the Chinese character input device developed by the inventors, the holographic memory plate measures 32 × 59 mm. With a holographic memory plate of this size, the reconstructed light beams (i.e., the first order diffracted light beams generated upon memory interrogation) for mini-holograms lying in the peripheral portion of the memory plate do not follow precisely the same light paths as those from mini-holograms recorded at the center of the plate. In other words, some aberrations are unavoidable — they are observed whenever a relatively large array of binary code representing light beams are employed. These error sources tend to cause faulty read-out operations since the effective light receiving area of the photodiodes is severely limited, and thus erroneously diverted rays impinging at acute angles of incidence are not always unfailingly sensed by the photodiodes.

It is therefore an object of this invention to provide hologram memory plates capable of reducing the undesired effects of aberrations which appear in the reconstructed light beam array, and to provide a method of manufacturing such memory plates.

The above-mentioned aberrations are attributed to the imaging lens which is used for forming images of the binary code representing coherent light beams, for forming their holograms at various positions on a photographic plate. More particularly, with an increase in the size of a photographic surface comprising a hologram plate, the angles of refraction given to the code-representing coherent light beams by the imaging lens is increased with the result that the reconstructed light beams originating from positions close to the periphery of the photographic plate are more severely affected by an aberration, i.e., a departure from an exact condition.

To reduce the deleterious effect of a lens aberration, the use of an imaging lens of a sufficiently large aperture and a large focal length would be effective. However, as is well known, such a lens is extremely expensive and inconvenient to handle. In the present invention, therefore, the area of the photographic plate constituting the holographic plate is divided into two or more sections, each of which is subjected to the mini-hologram forming process. The division of the photographic plate surface into two or more regions makes it possible to maintain the angle of refraction of the code-representing light rays at a small value, without resorting to such a large-aperture lens of long focal length.

Figure 1B:
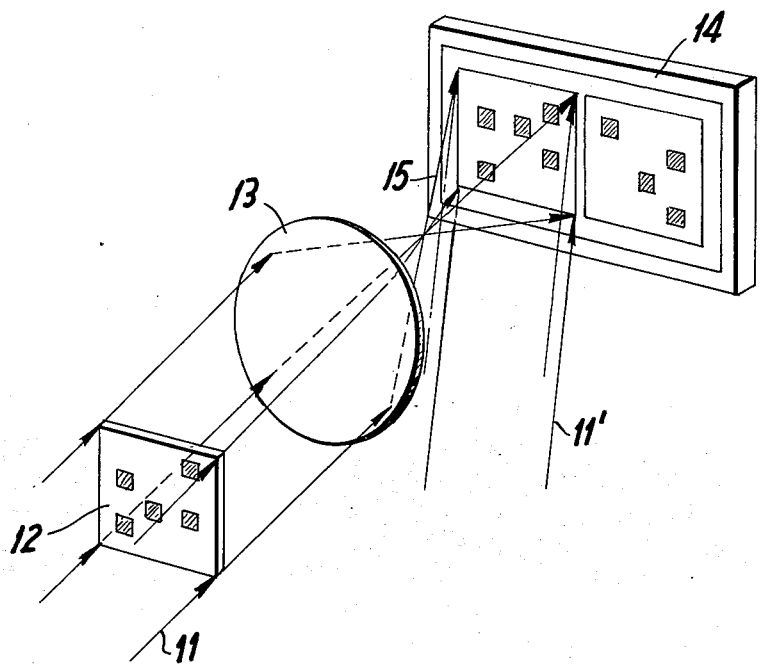
Figure 2:
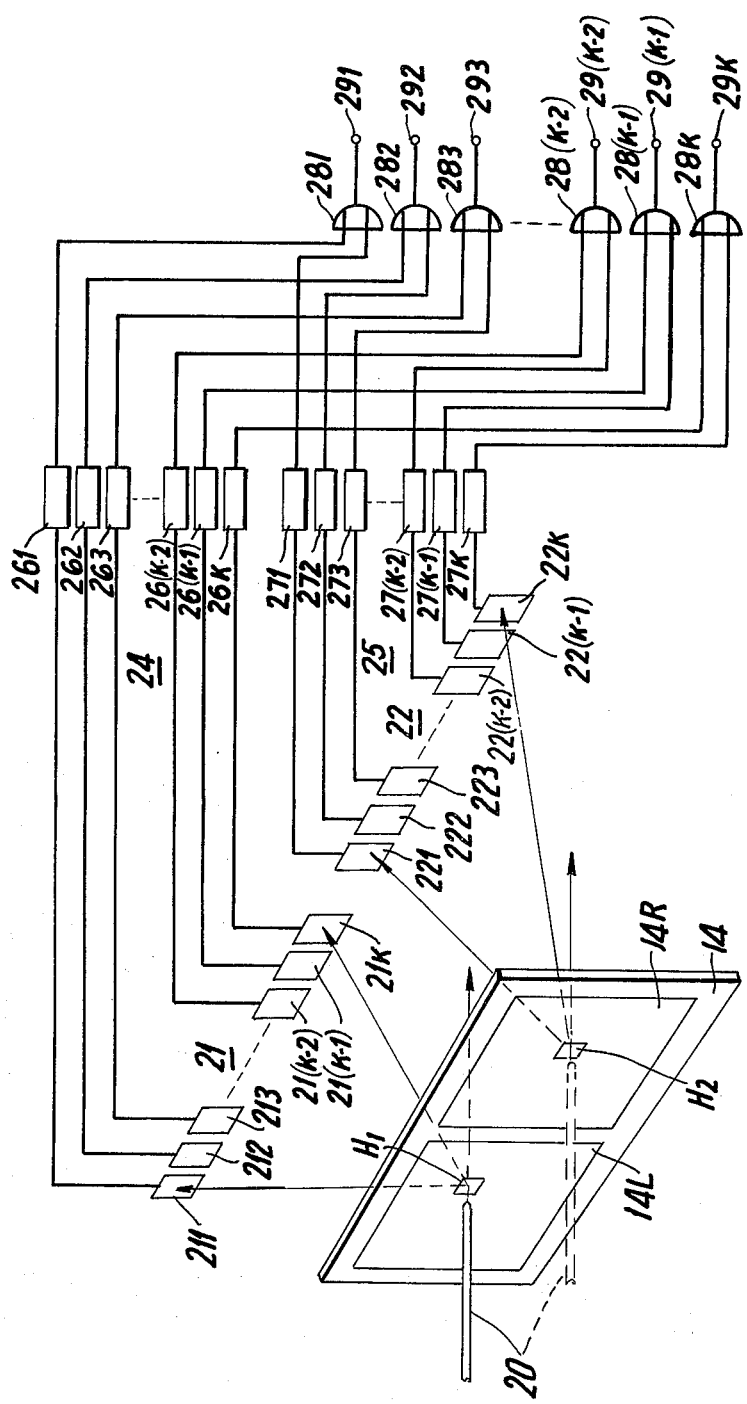
Figure 3:
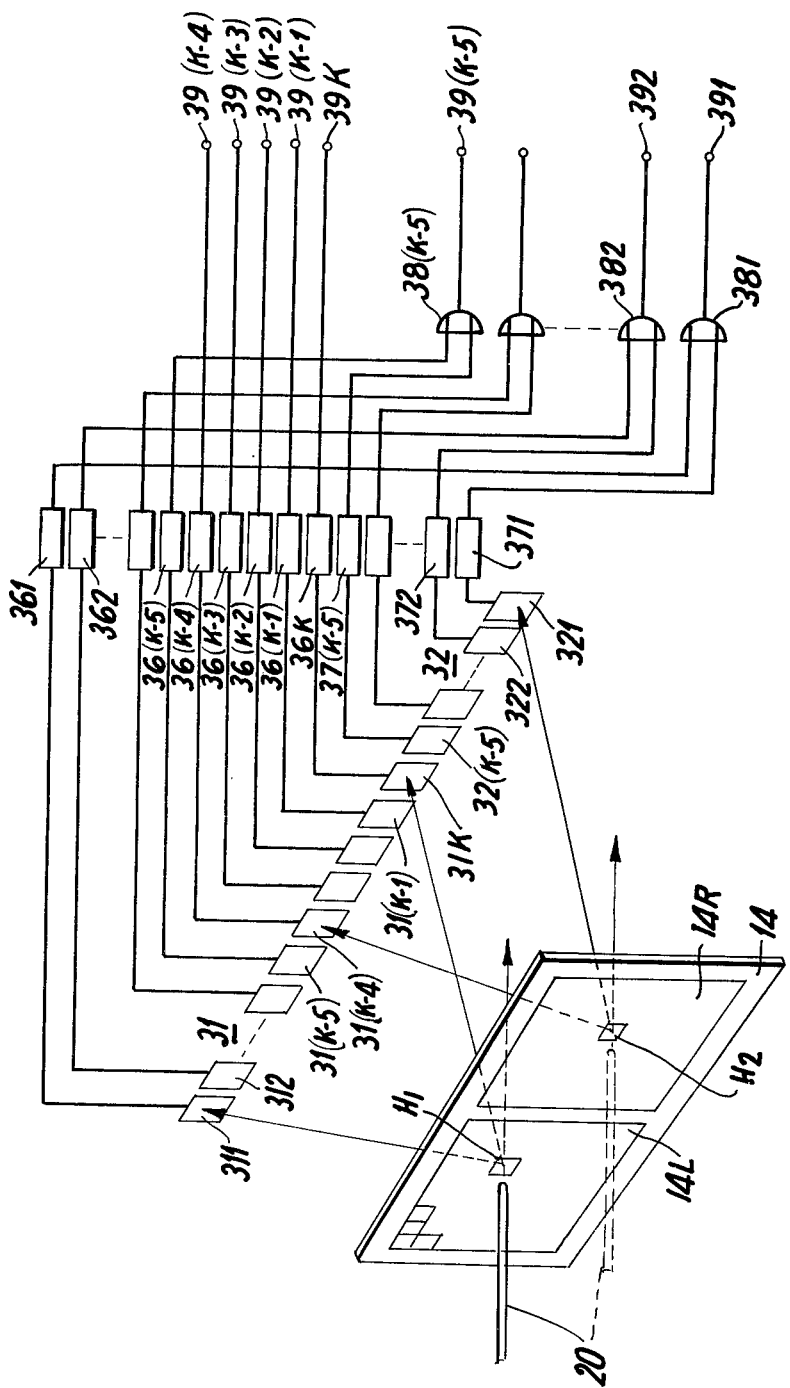

A specific, illustrative embodiment of the present invention will now be described in detail in conjunction with the accompanying drawing, wherein:

FIGS. 1a and 1b illustrate the process for forming a hologram memory plate according to the principles of the present invention; and FIGS. 2 and 3 schematically illustrate read out structure for the hologram memory plate.

Referring now to FIG. 1a, parallel coherent light beams 11 supplied from a laser device (not shown) are translated into object light beams which are space-modulated by a data mask 12 of a predetermined size provided with perforations of a predetermined pattern. The real image 12A of mask 12 is formed in the right half of a photographic plate 14 by an imaging lens 13. Coincidentally therewith, coherent light rays 11' supplied from the same laser source through a separate light path (not shown) illuminate the same area on the plate 14 to form an interference pattern with the real image 12A. The interference pattern is then photographically recorded on the plate 14. It is noted that the exposure is performed instantaneously by the use of a shutter (not shown). Further, such instantaneous exposure is performed repeatedly for a plurality of data mask with the angle of incidence of the reference rays 11' changed discretely as the data mask is changed. Thus, mini-holograms representative of the X and Y coordinates are produced in a matrix form. During this hologram recording processing, the left half of the photographic plate 14 is left entirely unexposed. In place of the above-described multiple exposure method, where the data masks 12 are prepared in advance and changed for each exposure, the mini-holograms may be sequentially and individually formed on the photographic plate 14, although a longer time is required.

When the formation of the matrix of mini-holograms is completed in the right half of the photographic plate 14, the plate 14 is moved to the right to bring the left half of the plate 14 into the exposure position [FIG. 1b]. Since the combinations of the data masks can be made completely different from those for the right half of the plate 14, the memory contents in the left half are in general entirely different from that in the right half plane.

Thus, the present arrangement divides the recording surface of the photographic plate in two for forming the mini-hologram matrix, making it possible to avoid the use of intolerably large refraction angles for the object beams to obviate the above-discussed aberrations. This also eliminates the use of a large-aperture imaging lens for producing the mini-holograms.

As is apparent from the foregoing description, the division into two sections of the photographic plate for forming the mini-hologram matrix horizontally widens the area in which the reconstructed light beam arrays are distributed. The length of the photodiode array for translating the reconstructed light beams back into the parallel digital signal should be correspondingly lengthened to intersect all the reconstructed light beams.

Describing now memory read out operation with reference to FIG. 2, the hologram memory plate 14 ready for read out contains the left section 14L and the right section 14R. When the light pen 20 is at the position indicated by the solid line to illuminate a small hologram $H_1$ in the left section 14L by a read out coherent light beam, an array of output light beams appears due to first order diffraction. A photodiode array 21 consisting of photodiodes 211, 212 ... $21k$ is disposed at a suitable distance from the back surface of the hologram memory plate 14 for converting the diffracted light beams into a parallel binary electrical signal.

When the light pen 20 is brought to another position indicated by the dotted line to illuminate a small hologram $H_2$ in the right section 14R via a coherent read out light beam, another array of diffraction output light beams appears at the rear of plate 14 for read out. These light beams impinge not on the photodiode array 21 but on another photodiode array 22 consisting of photodiodes $221-22k$ disposed adjacent to and aligned with the array 21. To cause the first order diffracted light beams to form an array of spot images on the desired one of the two diode arrays 21 and 22, depending on which of the left or right sections 14L or 14R has the desired mini-hologram to be read out, the angles of incidence of the reference light rays 11' and the object light beams 15 (FIG. 1) are suitably selected with respect to the plane of the photographic plate 14 at the time of holographic recording. Since this technique is known to those skilled in the art, further description will not be here presented.

Output signals from the diode arrays, $211-21k$ and $221-22k$ are respectively fed to sense amplifiers $261-26k$ and $271-27k$ through conductors 24 and 25. These signals are then applied to plural output terminals $291-29k$ through data converging OR gates $281-28k$. The sense amplifiers $261-26k$ and $271-27k$ and the OR (or other disjunctive logic) circuits $281-28k$ are interconnected such that the outputs of the amplifiers 261 and 271 are applied to the two inputs of the OR circuit 281; the outputs of amplifiers 262 and 272 are applied to gate 282 . . . ; and the outputs of amplifiers $26k$ and $27k$ are applied to the inputs of gate $28k$. Therefore, regardless of which of the left and right sections 14L and 14R includes a mini-hologram being interrogated, the corresponding parallel binary signal is always obtained at the output terminals 291 through 29K.

In the read out process shown in FIG. 2, the photodiode arrays 21 and 22 are disposed in a horizontal direction, hence requiring a greater number of photodiodes and other circuit elements, and impeding miniaturization of the composite apparatus. These disadvantages can be reduced by making a part of the photodiodes common to the arrays 21 and 22, thereby reducing the number of required elements. A modification of the emboidment of FIG. 2 for this purpose is illustrated in FIG. 3.

For simplicity of illustration, like constituents are denoted by like reference numerals in FIGS. 2 and 3, except that for such duplicative elements in FIG. 3 the most significant digit 3 replaces the digit 2 of FIG. 2. As will be clearly seen in FIG. 3, the first order diffraction beams from the mini-hologram $H_1$ in the left section 14L impinge on the diodes $311-31k$ of the diode array 31. Further, the first order diffraction beams from another mini-hologram $H_2$ in the right section impinge upon diodes $321-31(k-4)$ in the diode array 32. The five diodes $31(k-4)$ through $31k$ are thus common to both the diode arrays 31 and 32.

The outputs of these diodes $311-31k$ and $321-32(k-5)$ are respectively fed to the sense amplifiers $361-36k$ and $371-37(k-5)$ in the same manner as in the FIG. 2 structure. The outputs of the sense amplifiers $31(k-4)$ through $31k$ receiving the outputs of the five diodes $31(k-4)$ through $31k$ in the common section are directly connected to output terminals $39(k-4)$ through $39k$. Correspondingly, the other amplifiers 361 and 371 supply their outputs to the OR circuit 381; the outputs from amplifiers 362 and 372 are supplied to OR gate 382 . . . ; and the outputs from the amplifiers $36(k-5)$ and $37(k-5)$ are coupled to OR circuit $38(k-5)$. The read out scanning operation effected by the light pen 20 on the memory plate 14 is performed for one small hologram at a time to develop the characters for the above mentioned computer input device, there being no possibility of reading out two or more small holograms simultaneously. Therefore a parallel binary signal corresponding to each mini-hologram can be derived at the output terminals 391 through $39k$.

The Holotablet, Chinese character input device built by the inventors, contains a 88 × 35 mm. hologram memory plate, each of the left and right sections 14L and 14R including 44 × 35 elements comprising 1 × 1 mm mini-holograms. The binary signal recorded in each mini-hologram is formed of 16 bits. The photodiode array used in this practical implementation of the Holotablet device consists of 24 photodiodes, of which eight diodes are coupled in common to the left and right sections as shown in FIG. 3. These 24 diodes are disposed in a plane spaced 300 mm from the hologram memory plate 14 in a direction normal thereto, and shifted by 50 mm within the same plane from the point corresponding to the center of the plate 14 in the direction parallel to the short side thereof. The effective photo-sensitive surface area of each diode comprises 10 × 10 mm, and these diodes are arrayed at a regular spacing of 11 mm. This arrangement proved to be effective to eliminate the shift in the position of spot images of the diffracted readout light beams.

It will be obvious to those skilled in the art that the hologram plate 14 may be divided into three or more sections. While the embodiment has been described on the assumption that the hologram memory plate is applied to an X-Y coordinate digital signal converting device, it will also be obvious that the principles of the present invention are applicable to a case where the memory plate is utilized for a computer, e.g., as a read only memory (ROM) instruction and fixed operand store. In such a case, another read out scanning mechanism may be used in place of the light pen 20.

The above described arrangements are thus merely illustrative of the principles of the present invention. Numerous modifications and adaptations thereof will be readily apparent to those skilled in the art without departing from the spirit and scope of the present invention.

What is claimed is:

1. In combination, a holographic storage plate with plural mini-holograms recorded thereon, said mini-holograms being grouped into plural sections occupying different spacial areas on said storage plate, each of said mini-holograms storing plural information digits, and a plurality of photodiode arrays each associated with a different one of said holographic storage plate sections, each of said diode arrays being spaced from said plate for receiving from said associated plate section a plural digit light pattern when any mini-hologram in the associated plate section is interrogated, wherein a subset of the photodiodes in plural of said photodiode arrays are common.

2. A combination as in claim 1 further comprising output terminals, and data converging means for supplying output signals from one of said plural photodiode arrays to said output terminals.

3. A combination as in claim 2 wherein said data converging means comprises disjunctive logic means for supplying signals from the activated one of said plural photodetector arrays to said output terminals.

4. A combination as in claim 1, wherein each of said mini-holograms have binary coded positional information corresponding to the position of the hologram recorded therein, wherein said holographic storage plate sections are disposed along a first line and said photodiode arrays are disposed along a second line having the same direction as said first line, and wherein said common diode subset is disposed between non-common photodiodes of adjacent photodiode arrays such that each said plural digit light pattern illuminates both common and non-common photodiodes.

5. A method of storing information on and reading information from a photographic storage medium comprising the steps of:

successively exposing a first area of said storage medium to first interference patterns formed one after another between first coherent light rays and second coherent light rays spaced-modulated one after another by a plurality of perforated masks with prearranged perforations formed therein to represent binary one and zero digits, said successive exposures resulting in the recording of mini-holograms correspondingly to the arrangements of said perforations; successively exposing a second area of said storage medium to second interference patterns to result in the recording of a separate set of mini-holograms;

developing said storage medium;

directing an interrogation coherent light beam of a size comparable to each of said mini-holograms to a desired position on said storage medium in a direction normal thereto;

directing an information-carrying diffracted component of said coherent light beam at either a first or second spaced light detector array, depending upon which of said storage medium areas is irradiated by said interrogation coherent light beam; wherein the dimensions of each said first and second areas are such that said diffracted component has substantially no aberration, and the step of detecting the diffracted coherent light component comprising directing said diffracted coherent light component to one of a plurality of photodiode arrays placed in line behind said storage medium and leading the output of each said photodiode array to a logic circuit, wherein a subset of the photodiodes in said plurality of photodiode arrays are common.

* * * * *